(12) United States Patent
Huang et al.

(10) Patent No.: US 11,217,732 B2
(45) Date of Patent: Jan. 4, 2022

(54) WHITE LIGHT LED PACKAGE STRUCTURE AND WHITE LIGHT SOURCE SYSTEM

(71) Applicant: Xiamen Sanan Optoelectronics Technology Co., Ltd., Xiamen (CN)

(72) Inventors: Senpeng Huang, Xiamen (CN); Junpeng Shi, Xiamen (CN); Weng-Tack Wong, Xiamen (CN); Shunyi Chen, Xiamen (CN); Zhenduan Lin, Xiamen (CN); Chih-Wei Chao, Xiamen (CN); Chen-Ke Hsu, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 121 days.

(21) Appl. No.: 16/810,523

(22) Filed: Mar. 5, 2020

(65) Prior Publication Data
US 2020/0203582 A1   Jun. 25, 2020

Related U.S. Application Data

(63) Continuation of application No. PCT/CN2017/101898, filed on Sep. 15, 2017.

(51) Int. Cl.
*H01L 33/50* (2010.01)
*H01L 33/54* (2010.01)
*H01L 33/56* (2010.01)

(52) U.S. Cl.
CPC ............ *H01L 33/504* (2013.01); *H01L 33/54* (2013.01); *H01L 33/56* (2013.01)

(58) Field of Classification Search
CPC ........ H01L 33/504; H01L 33/54; H01L 33/56
See application file for complete search history.

(56) References Cited

U.S. PATENT DOCUMENTS 9,269,873 B2 * 2/2016 Imazu .................. H01L 33/50
9,570,424 B2 * 2/2017 Nam ................... H01L 25/0753
(Continued)

FOREIGN PATENT DOCUMENTS

CN     101124682 A     2/2008
CN     101542753 A     9/2009
(Continued)

OTHER PUBLICATIONS

International search report dated Jun. 19, 2018 from corresponding application No. PCT/CN2017/101898.
(Continued)

*Primary Examiner* — Mark W Tornow
(74) *Attorney, Agent, or Firm* — Hauptman Ham, LLP

(57) ABSTRACT

The present invention provides a white light LED package structure and a white light source system, which includes a substrate, an LED chip, and a wavelength conversion material layer. The peak emission wavelength of the LED chip is between 400 nm and 425 nm; the peak emission wavelength of the wavelength conversion material layer is between 440 nm and 700 nm, and the wavelength conversion material layer absorbs light emitted from the LED chip and emits a white light source; and the emission spectrum of the white light source is set as $P(\lambda)$, the emission spectrum of a blackbody radiation having the same color temperature as the white light source is $S(\lambda)$, $P(\lambda_{max})$ is the maximum light intensity within 380-780 nm, $S(\lambda_{max})$ is the maximum light intensity of the blackbody radiation within 380-780 nm, $D(\lambda)$ is a difference between the spectrum of the white light LED and the spectrum of the blackbody radiation, and within 510-610 nm, the white light source satisfies: $D(\lambda)=P(\lambda)/P(\lambda_{max})-S(W)/S(\lambda_{max})$, $-0.15<D(\lambda)<0.15$.

17 Claims, 4 Drawing Sheets

(56) References Cited

U.S. PATENT DOCUMENTS

| | | | | |
|---|---|---|---|---|
| 2006/0055309 A1* | 3/2006 | Ono | ............... | H01L 25/0753 |
| | | | | 313/492 |
| 2007/0297108 A1* | 12/2007 | Collins, III | ......... | H01L 25/167 |
| | | | | 361/56 |
| 2012/0113328 A1* | 5/2012 | Takeshima | ........ | G02F 1/133603 |
| | | | | 348/739 |
| 2012/0313130 A1* | 12/2012 | Ramer | ................ | H01L 33/502 |
| | | | | 257/98 |
| 2013/0277689 A1* | 10/2013 | Lemay | ................ | G02B 5/282 |
| | | | | 257/88 |
| 2014/0264412 A1* | 9/2014 | Yoon | ................ | H01L 33/504 |
| | | | | 257/98 |

FOREIGN PATENT DOCUMENTS

| | | | |
|---|---|---|---|
| CN | 102782887 A | 11/2012 |
| CN | 102903706 A | 1/2013 |
| CN | 103227255 A | 7/2013 |
| CN | 103339750 A | 10/2013 |

OTHER PUBLICATIONS

Office Action issued in corresponding Chinese Application No. 201780056404.4; dated Dec. 21, 2020; State Intellectual Property Office of the P.R. China, Beijing, China, 13 pgs.

Search Report issued in corresponding Chinese Application No. 201780056404.4; dated Dec. 11, 2020; State Intellectual Property Office of the P.R. China, Beijing, China, 5 pgs.

* cited by examiner

WHITE LIGHT LED PACKAGE STRUCTURE AND WHITE LIGHT SOURCE SYSTEM

TECHNICAL FIELD

The present invention relates to the technical field of semiconductors, and in particular, to a white light LED package structure and a white light source system.

BACKGROUND

A light-emitting diode (LED) is a solid semiconductor light-emitting device. Existing LED light-emitting devices generally use blue LEDs to excite green, yellow, and red phosphors to obtain mixed white light. However, due to the discontinuity of this white light spectrum, some color rendering indexes are lower than 90. In addition, the white light LEDs produced by the existing blue chips have obvious blue light hazards, causing widespread debate among the industry and consumers.

The use of a ultraviolet chip or a near-ultraviolet chip to excite RGB three-color phosphors can achieve a continuous spectrum similar to a solar spectrum. However, at this stage, ultraviolet chips or near-ultraviolet chips have poor anti-static capabilities than blue chips, and usually need to install additional ESD-resistant electronic elements, but the additional ESD-resistant electronic elements need increasing the volume of a package and affect the light emitting structure.

SUMMARY

In order to overcome the shortcomings of the prior art, the present invention provides a white light LED package structure and a white light source system, including: a substrate, an LED chip on the substrate, and a wavelength conversion material layer on the LED chip, wherein, the peak emission wavelength of the LED chip is between 400 nm and 425 nm;

the peak emission wavelength of the wavelength conversion material layer is between 440 nm and 700 nm, and the wavelength conversion material layer emits a white light source by absorbing light emitted from the LED chip; and set a emission spectrum of the white light source as $P(\lambda)$, a emission spectrum of a blackbody radiation having the same color temperature as the white light source as $S(\lambda)$, $P(\lambda_{max})$ is the maximum light intensity within 380-780 nm, $S(\lambda_{max})$ is the maximum light intensity of the blackbody radiator within 380-780 nm, $D(\lambda)$ represents the difference between the spectrum of the white light LED and the spectrum of the blackbody radiation, and within 510-610 nm, the white light source satisfies the following relationship: $D(\lambda)=P(\lambda)/P(\lambda_{max})-S(\lambda)/S(\lambda_{max})$, $-0.15<D(\lambda)<0.15$.

Preferably, the wavelength conversion material layer includes at least three kinds of phosphors with different peak emission wavelengths.

Preferably, the wavelength conversion material layer includes three or more phosphors with a peak emission wavelength of 440-500 nm, or 500-575 nm, or 620-700 nm.

Preferably, the substrate is made of ZnO, or made of ZnO as a main material (doped with other metals), or titanate or zirconate material such as $CaSrZrO_3$, or $BaTiO_3$, or $BaSrTiO_3$.

Preferably, a metal laminate is disposed on the upper surface of the substrate, or the lower surface of the substrate, or inside the substrate.

Preferably, the distance between the metal laminate and the outer edge of the substrate is not less than 0.05 mm.

Preferably, the distance between the metal laminate and the outer edge of the substrate is not less than 0.2 mm.

Preferably, the metal laminate includes at least two layers.

Preferably, the metal laminate is made of Ag or Pd or Ni or any combination thereof.

Preferably, further includes a reflective material layer located around the LED chip.

Preferably, the color rendering indexes (CIE CRI standard) R1-R15 of the white light source are not less than 90.

Preferably, the color fidelity Rf (color fidelity, IES TM-30-15 standard) of the white light source is not less than 93.

Preferably, the color temperature of the white light source is between 2500 K and 7000 K.

Preferably, a white light source system is provided, including the above white light LED package structure.

the white light LED package structure and the white light source system provided by the present invention have at least the following technical effects:

(1) the problem of low color rendering index of white light is effectively solved, the color rendering index of white light LEDs are increased, and the blue light hazards of white light LEDs are reduced;

(2) a solution of improving the anti-static and anti-surge capabilities of white light LEDs made of ultraviolet chips or near-ultraviolet chips is provided; and (3) a compact white light package structure and a white light source system are provided.

Other features and advantages of the present invention will be explained in the following description, and will be understood by implementing the present invention. The objects and other advantages of the present invention can be achieved and obtained by the structures specifically shown in the description, the claims, and the drawings.

BRIEF DESCRIPTION OF THE DRAWINGS

The drawings are used to provide a further understanding of the present invention, constitute a part of the description, explain the present invention together with embodiments of the present invention, and are not intended to limit the present invention. In addition, data of the drawings is descriptive and is not necessarily drawn in proportion.

Figure 1:
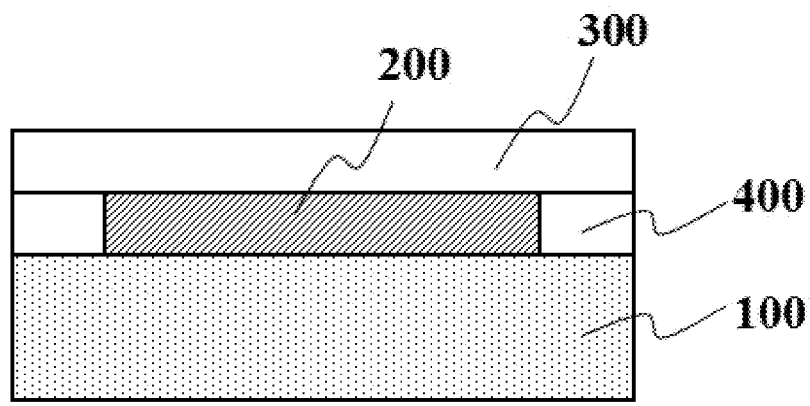
FIG. 1 is a schematic cross-sectional diagram of a white light LED package structure of Embodiment 1.

The reference numerals in the drawings are as follows: 100: substrate; 101: upper surface; 102: lower surface; 103: metal laminate; 200: LED chip; 300: wavelength conversion material layer; 400: reflective material layer; X: the distance between the metal laminate and the outer edge of the substrate.

DETAILED DESCRIPTION

The white light LED package structure of the present invention is described in detail below with reference to schematic diagrams. Before further introduction of the present invention, it should be understood that, since specific examples can be modified, the present invention is not limited to the specific examples described below. It should also be understood that, since the scope of the present invention is limited only by the appended claims, the examples employed are merely introductory rather than restrictive.

Unless otherwise defined, all terms (including technical and scientific terms) used in the present invention have the same meanings as commonly understood by a person of ordinary skill in the art to which the present invention belongs. It should be further understood that the terms used in the present invention should be understood to have consistent meanings in the context of the present description and related fields, and should not be understood in an idealized sense, unless explicitly defined in the present invention.

Example 1

Figure 2:
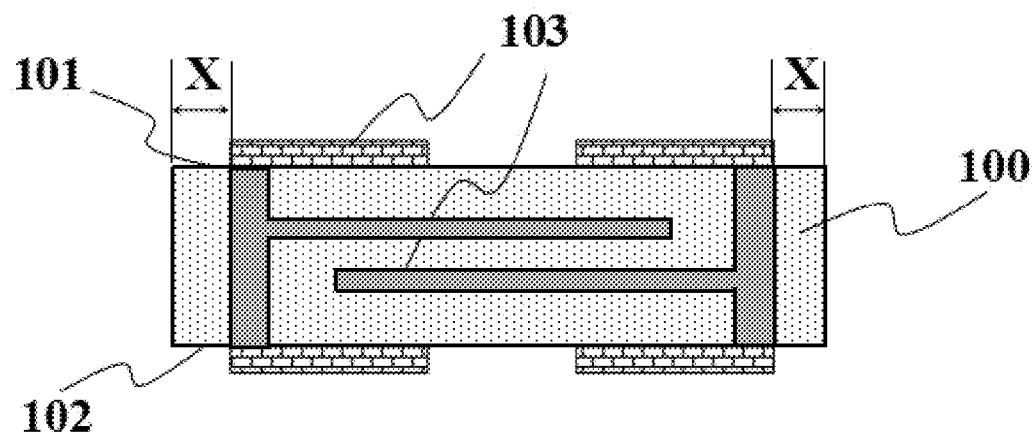
FIG. 2 is an enlarged view of a substrate in FIG. 1.

As shown in FIGS. 1 and 2, the present example provides a white light LED package structure, including: a substrate 100, an LED chip 200 on the substrate 100, and a wavelength conversion material layer 300 on the LED chip 200, where the LED chip is a ultraviolet or near-ultraviolet chip, and has a peak emission wavelength between 400 nm and 425 nm; the peak emission wavelength of the wavelength conversion material layer is between 440 nm and 700 nm, and the wavelength conversion material layer emits white light source by absorbing light emitted from the LED chip; and set the emission spectrum of the white light source as $P(\lambda)$, the emission spectrum of a blackbody radiation having the same color temperature as the white light source is $S(\lambda)$, $P(\lambda_{max})$ is the maximum light intensity within 380-780 nm, $S(\lambda_{max})$ is the maximum light intensity of the blackbody radiation within 380-780 nm, $D(\lambda)$ represents a difference between the spectrum of a white light LED and the spectrum of the blackbody radiation and within 510-610 nm, the white light source satisfies the following relationship: $D(\lambda)=P(\lambda)/P(\lambda_{max})-S(k)/S(\lambda_{max})$, $-0.15<D(\lambda)<0.15$.

The LED chip 200 is fixed on the substrate 100. The LED chip 200 may be a flip-chip and/or a lateral-chip and/or a vertical-chip and/or a high-voltage chip, or any combination thereof. In the present example, the flip-chip is preferred. The substrate 100 is made of a material having static electricity and surge protection capabilities. Preferably, the substrate 100 is made of ZnO, or ZnO as a main material (including doping with other metals), or titanate or zirconate such as $CaSrZrO_3$ or $BaTiO_3$ or $BaSrTiO_3$. The structure can be made into a multi-layer varistor or a multi-layer ceramic capacitor.

The thickness of the substrate is between 0.25 mm and 0.5 mm, preferably, the thickness of the substrate is not more than 0.35 mm. A metal laminate 103 is disposed on at least one of an upper surface 101 or a lower surface 102 of the substrate 100. In this example, metal laminates are preferably disposed on both the upper and lower surfaces of the substrate 100. The metal laminate on the upper surface is used to connect to an electrode of the LED chip. The metal laminate on the lower surface is used to connect to an external power supply. In addition to be disposed on the substrate, the metal laminate can also be located inside the substrate. The cross sectional shape of the metal laminate inside the substrate is a cross-T-shape, which is connected to the metal laminate on the upper and lower surfaces of the substrate, respectively.

In order to improve the ESD resistance of the LED package structure and reduce the risk of electricity leakage, the distance X between the metal laminate 103 and the outer edge of the substrate 100 is not less than 0.05 mm, preferably not less than 0.2 mm. The purpose of setting a specific distance X is to prevent the LED package structure from leaking electricity during use. If the distance is too small, the metal layer in the substrate may be damaged due to cutting, and thus electricity leakage may occur during use.

The material used for the metal laminate 103 may include a metal such as Ag, Pd or Ni, or a metal alloy, preferably, the metal laminate 103 includes at least two layers. As the number of layers is greater, the antistatic capability and the transient surge impact resistant capability are stronger. More preferably, the number of layers is not less than 6.

The upper surface 101 of the substrate is connected to the LED chip 200. The upper surface 101 may further be provided with a reflective material layer having reflectivity greater than 80%.

A reflective material layer 400 is disposed around the LED chip and has reflectivity greater than 80%, preferably about 90%, which can effectively improve the front light output brightness.

The wavelength conversion material layer 300 is coated above the LED chip, and the wavelength conversion material layer includes at least three phosphors having different peak emission wavelengths. Preferably, the wavelength conversion material layer includes three or more phosphors with a peak emission wavelength, for example, three phorphors are respectively with the peak emission wavelength among the range 440-500 nm, 500-575 nm and 620-700 nm.

In the range of 510 nm to 610 nm, that is, the half-wave width range of the photopic luminosity function, the light intensity distribution of the white light source satisfies the following relationship: $D(\lambda)=P(\lambda)/P(\lambda_{max})-S(k)/S(\lambda_{max})$, $-0.15<D(\lambda)<0.15$, wherein the emission spectrum of the white light source is $P(\lambda)$, the emission spectrum of a blackbody radiation having the same color temperature as the white light source is $S(\lambda)$, $P(\lambda_{max})$ is the maximum light intensity within 380-780 nm, and $S(\lambda_{max})$ is the maximum light intensity of the blackbody radiation within 380-780 nm. $D(\lambda)$ represents a difference between the spectrum of a white light LED and the spectrum of the blackbody radiation.

The color rendering indexes (CIE CRI standard) R1-R15 of the white light source are not less than 90, the color fidelity Rf (IES TM-30-15 standard) is not less than 93, and the color temperature of the white light source is between 2500 K and 7000 K.

Figure 3:
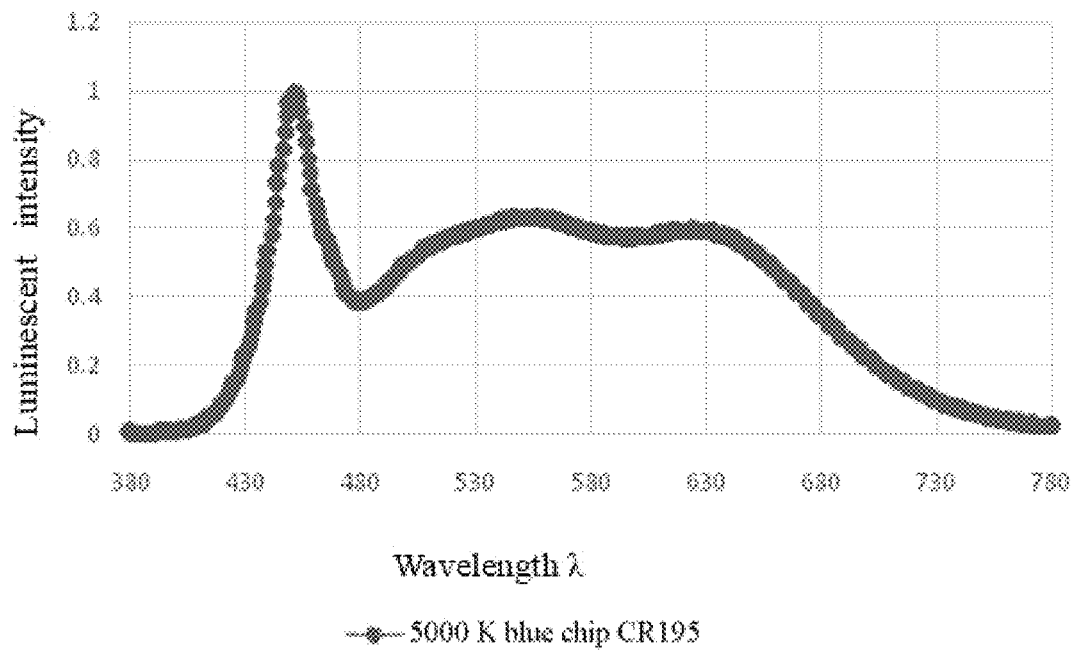
FIG. 3 is a graph of a emission spectrum of a comparative example.
Figure 4:
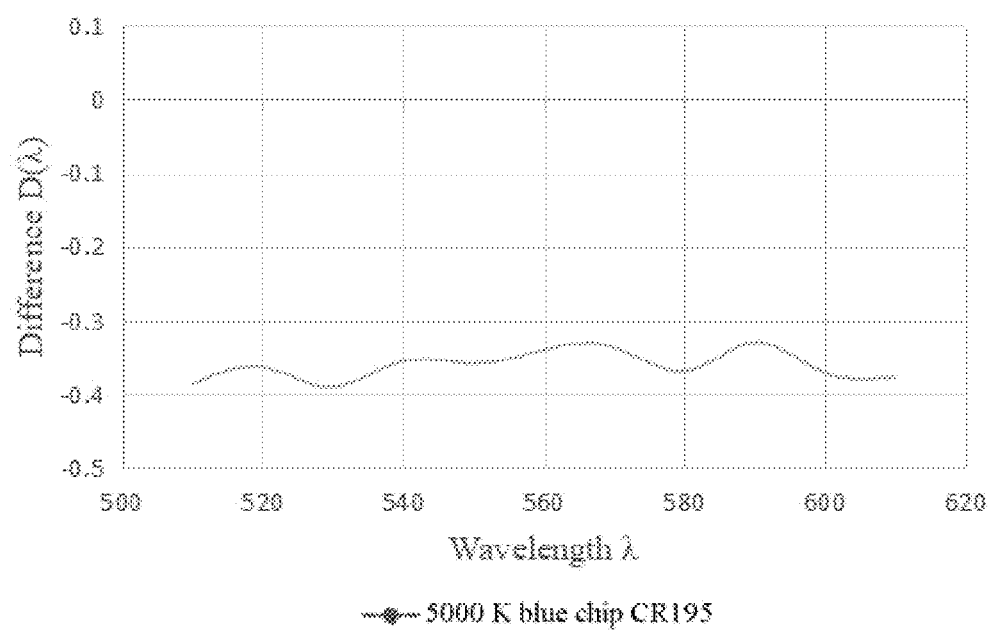
FIG. 4 is a $D(\lambda)$ graph of a comparative example.
Figure 5:
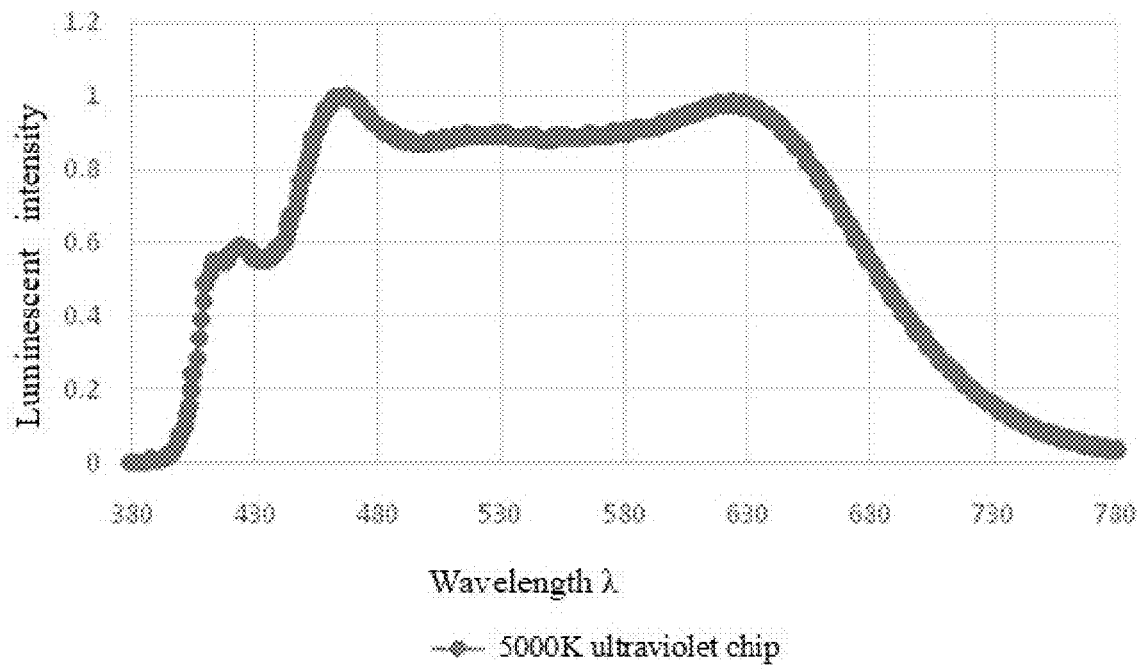
FIG. 5 is a graph of a emission spectrum of Example 1.
Figure 6:
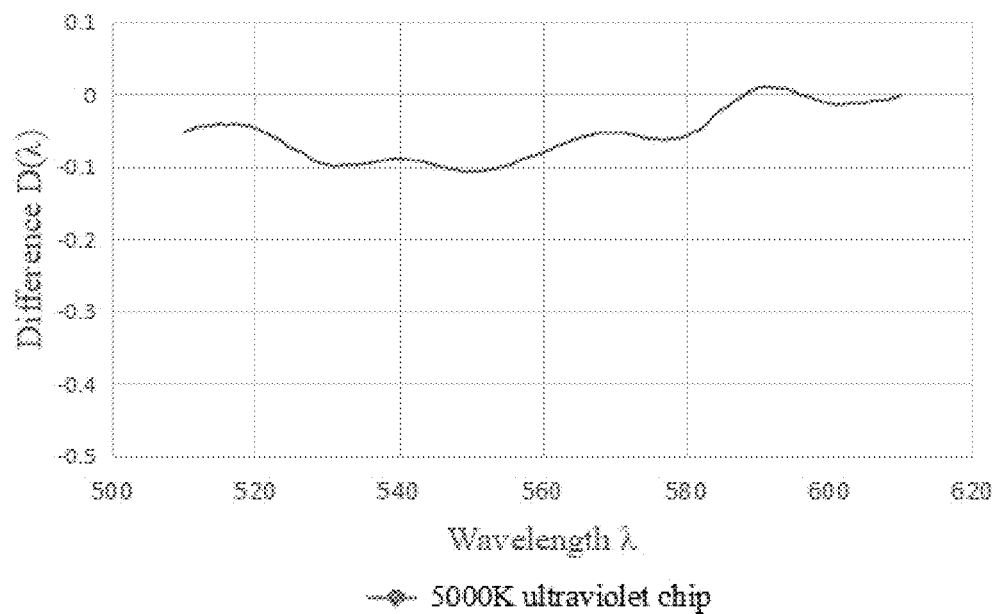
FIG. 6 is a $D(\lambda)$ graph of Example 1.

As shown in FIGS. 3 and 4, a comparative example, uses a white light source made of a conventional blue LED and phosphor. The difference $D(\lambda)$ between the spectrum of the white light LED spectrum and the spectrum of the blackbody radiation is between −0.3 and −0.4. As shown in FIGS. 5 and 6, this example, use a white light source made of a ultraviolet or near-ultraviolet LED and phosphors. The difference $D(\lambda)$ between the spectrum of the white light LED and the spectrum of the blackbody radiation is between −0.15 and −0.15. That is, compared with the comparative example, $D(\lambda)$ is significantly smaller, and the emission spectrum is closer to natural light.

The white light LED package structure provided in the present example can be made into a white light source system for local search, signal recognition, etc. on land, in the air, or on the ocean, or can be used in daily applications, such as backlight for liquid crystal displays (LCDs) and general lighting equipment, especially suitable for mobile phones, camera flashes, etc.

Example 2

Figure 7:
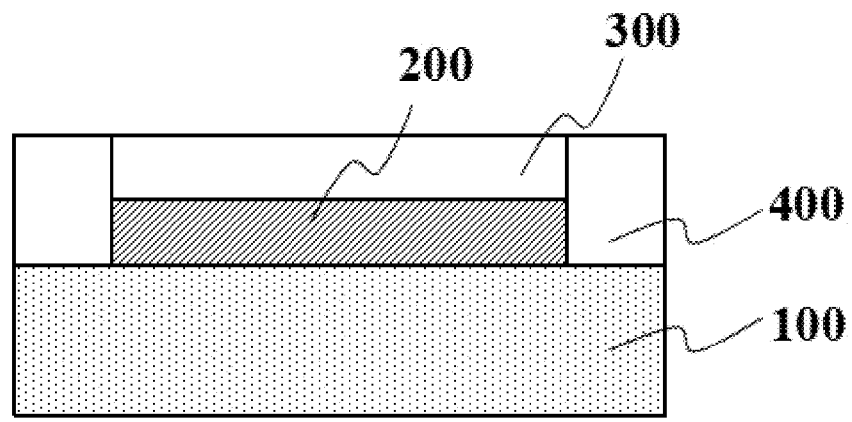
FIG. 7 is a schematic cross-sectional diagram of a white light LED package structure of Example 2.

As shown in FIG. 7, the difference from Example 1 is that the reflective material layer 400 is disposed on the side of the LED chip 200 in Example 1, and a wavelength conversion material layer 300 covers on the LED chip 200 and the reflective material layer 400. However, the wavelength conversion material layer 300 of the present example only covers the upper surfaces of the LED chip 200, and the reflective material layer 400 surrounds the LED chip 200 and the side of the wavelength conversion material layer 300, thereby reducing the light-emitting surface, effectively controlling the edge contour of light emission, and improving the uniformity of color coordinates, and thus it is more convenient to design a white light source by using the white light LED package structure.

Example 3

Figure 8:
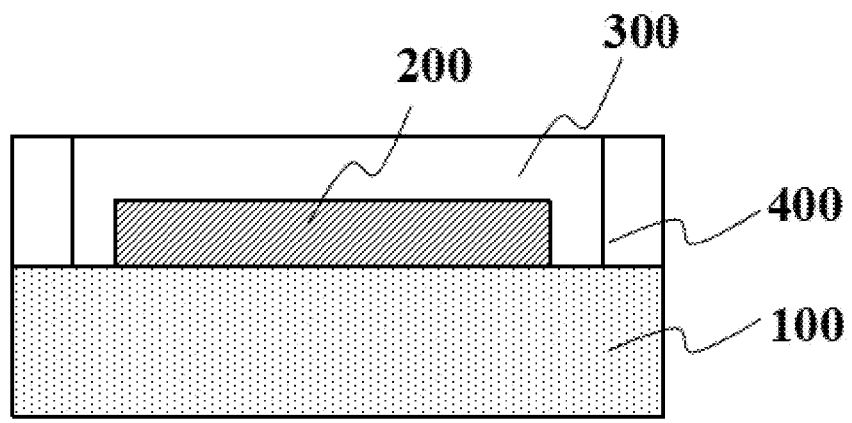
FIG. 8 is a schematic cross-sectional diagram of a white light LED package structure of Example 3.

As shown in FIG. 8, the difference from Example 1 is that the reflective material layer 400 is disposed on the side of the LED chip 200 in Example 1, and the wavelength conversion material layer 300 is covered on the LED chip 200 and the reflective material layer 400. However, the wavelength conversion material layer 300 of the present example covers the upper surface and the side surface of the LED chip 200, and the reflective material layer 400 is disposed on the side surface of the wavelength conversion material layer 300. Compared with Example 1, the present embodiment has a smaller light-emitting surface, can effectively control the edge contour of light emission, and has better uniformity of the color coordinates. Compared with Example 2, the present example can more effectively utilize the side surface of the LED chip to emit light, so that the brightness of the light source is higher.

It should be understood that the above specific implementations are only some preferred examples of the present invention, and the above examples can also be variously combined and modified. The scope of the present invention is not limited to the above examples, and any changes made according to the present invention fall within the scope of protection of the present invention.

The invention claimed is:

1. A white light LED package structure, comprising: a substrate, an LED chip, and a wavelength conversion material layer, wherein the peak emission wavelength of the LED chip is between 400 nm and 425 nm;

the peak emission wavelength of the wavelength conversion material layer is between 440 nm and 700 nm, and the wavelength conversion material layer emits a white light source by absorbing light emitted from the LED chip; and set a emission spectrum of the white light source as $P(\lambda)$, a emission spectrum of a blackbody radiation having a same color temperature as the white light source is $S(\lambda)$, $P(\lambda_{max})$ is a maximum light intensity within 380-780 nm, $S(\lambda_{max})$ is a maximum light intensity of the blackbody radiation within 380-780 nm, $D(\lambda)$ represents a difference between a spectrum of a white light LED and a spectrum of the blackbody radiation and within 510-610 nm, the white light source satisfies the following relationship: $D(\lambda)=P(\lambda)/P(\lambda_{max})-S(\lambda)/S(\lambda_{max})$, $-0.15<D(\lambda)<0.15$.

2. The white light LED package structure according to claim 1, wherein the wavelength conversion material layer comprises at least three kinds of phosphors with different peak emission wavelengths.

3. The white light LED package structure according to claim 1, wherein the wavelength conversion material layer comprises three or more phosphors with peak emission wavelengths of 440-500 nm, 500-575 nm, and 620-700 nm.

4. The white light LED package structure according to claim 1, wherein the substrate is made of ZnO, or made of ZnO as a main material and doped with metals, or made of $CaSrZrO_3$, or $BaTiO_3$, or $BaSrTiO_3$.

5. The white light LED package structure according to claim 1, wherein a metal laminate is disposed on an upper surface of the substrate, or on a lower surface of the substrate, or inside the substrate.

6. The white light LED package structure according to claim 5, wherein the cross sectional shape of the metal laminate inside the substrate is a cross-T-shape.

7. The white light LED package structure according to claim 5, wherein a distance between the metal laminate and a outer edge of the substrate is not less than 0.05 mm.

8. The white light LED package structure according to claim 5, wherein a distance between the metal laminate and a outer edge of the substrate is not less than 0.2 mm.

9. The white light LED package structure according to claim 5, wherein the metal laminate comprises at least two layers.

10. The white light LED package structure according to claim 5, wherein the metal laminate is made of Ag or Pd or Ni or any combination thereof.

11. The white light LED package structure according to claim 1, further comprising a reflective material layer located around the LED chip.

12. The white light LED package structure according to claim 11, wherein the wavelength conversion material layer only covers on an upper side of the LED chip.

13. The white light LED package structure according to claim 11, wherein the wavelength conversion material layer covers on an upper surface and side surfaces of the LED chip, the reflective material layer is disposed on the side surfaces of the wavelength conversion material layer.

14. The white light LED package structure according to claim 1, wherein a color rendering indexes R1-R15 of the white light source are not less than 90.

15. The white light LED package structure according to claim 1, wherein a color fidelity Rf of the white light source is not less than 93.

16. The white light LED package structure according to claim 1, wherein a color temperature of the white light source is between 2500 K and 7000 K.

17. A white light source system, comprising the white light LED package structure according to claim 1.

* * * * *